United States Patent
Kim et al.

(10) Patent No.: US 8,537,591 B2
(45) Date of Patent: Sep. 17, 2013

(54) VARIABLE RESISTANCE DEVICES, SEMICONDUCTOR DEVICES INCLUDING THE VARIABLE RESISTANCE DEVICES, AND METHODS OF OPERATING THE SEMICONDUCTOR DEVICES

(75) Inventors: Young-bae Kim, Seoul (KR); Chang-bum Lee, Seoul (KR); Dong-soo Lee, Gunpo-si (KR); Chang-jung Kim, Yongin-si (KR); Myoung-jae Lee, Hwaseong-si (KR); Man Chang, Seongnam-si (KR); Seung-ryul Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 275 days.

(21) Appl. No.: 12/926,404

(22) Filed: Nov. 16, 2010

(65) Prior Publication Data
US 2011/0310652 A1    Dec. 22, 2011

(30) Foreign Application Priority Data

Jun. 22, 2010  (KR) ........................ 10-2010-0059108

(51) Int. Cl.
*G11C 11/00*   (2006.01)
(52) U.S. Cl.
USPC ......................................................... 365/148
(58) Field of Classification Search
USPC .................................. 365/148, 158
See application file for complete search history.

(56) References Cited

U.S. PATENT DOCUMENTS

| | | |
|---|---|---|
| 6,930,909 B2 | 8/2005 | Moore et al. |
| 7,471,543 B2 | 12/2008 | Nakashima et al. |
| 2003/0156445 A1 | 8/2003 | Zhuang et al. |
| 2004/0264234 A1 | 12/2004 | Moore et al. |
| 2007/0070682 A1 | 3/2007 | Nakashima et al. |
| 2009/0109737 A1 | 4/2009 | Kostylev |

(Continued)

FOREIGN PATENT DOCUMENTS

| | | |
|---|---|---|
| JP | 2006-019444 A | 1/2006 |
| KR | 10-0576369 B1 | 4/2006 |

(Continued)

OTHER PUBLICATIONS

M. Terai, et al. "Resistance Controllability of $Ta_2O_5/TiO_2$ Stack ReRAM for Low-Voltage and Multilevel Operation," IEEE Electron Device Letters, IEEE Service Center, New York, NY, US. vol. 31, No. 3, Mar. 1, 2010, pp. 204-206.
European Search Report issued on Apr. 27, 2011, in corresponding European Patent Application No. 11154227.0-1233.

*Primary Examiner* — Anthan Tran
(74) *Attorney, Agent, or Firm* — Harness, Dickey & Pierce, P.L.C.

(57) ABSTRACT

Methods of operating semiconductor devices that include variable resistance devices, the methods including writing first data to a semiconductor device by applying a reset pulse voltage to the variable resistance device so that the variable resistance device is switched from a first resistance state to a second resistance state, and writing second data to the semiconductor device by applying a set pulse voltage to the variable resistance device so that the variable resistance device is switched from the second resistance state to the first resistance state to the second resistance state. The reset pulse voltage is higher than the set pulse voltage, and a resistance in the second resistance state is greater than in the first resistance state.

33 Claims, 9 Drawing Sheets

(56) References Cited

U.S. PATENT DOCUMENTS

2009/0212273 A1    8/2009  Zhao et al.
2009/0279350 A1*  11/2009  Chen et al. .................... 365/163
2011/0176351 A1*   7/2011  Fujitsuka et al. ............. 365/148

FOREIGN PATENT DOCUMENTS

| KR | 10-2009-0014491 A | 2/2009 |
| WO | WO 2005/059921 | 6/2005 |
| WO | WO 2009/150608 | 12/2009 |

* cited by examiner

VARIABLE RESISTANCE DEVICES, SEMICONDUCTOR DEVICES INCLUDING THE VARIABLE RESISTANCE DEVICES, AND METHODS OF OPERATING THE SEMICONDUCTOR DEVICES

CROSS-REFERENCE TO RELATED APPLICATIONS

This application claims priority under 35 U.S.C. §119 to Korean Patent Application No. 10-2010-0059108, filed on Jun. 22, 2010, in the Korean Intellectual Property Office (KIPO), the entire contents of which is incorporated herein by reference.

BACKGROUND

1. Field

Example embodiments relate to semiconductor devices, and more particularly, to variable resistance devices, semiconductor devices that include the variable resistance devices, and methods of operating the semiconductor devices.

2. Description of the Related Art

Memory devices may be non-volatile and may not need to be refreshed. Types of non-volatile memory devices may include phase change RAM (PRAM), Nano Floating Gate Memory (NFGM), Polymer RAM (PoRAM), Magnetic RAM (MRAM), Ferroelectric RAM (FeRAM) and Resistive RAM (RRAM).

RRAM is based on the phenomenon that a current path may be generated when a sufficiently high voltage is applied to a variably resistive material. The generation of the path results in a lowered electrical resistance. Once the path is generated, the path may be canceled or regenerated by applying an adequate voltage to the variably resistive material.

SUMMARY

Provided are variable resistance devices, in which a difference between resistances in a high resistance state and a low resistance state is increased so as to improve the reliability of the variable resistance devices, semiconductor devices that include the variable resistance devices, and methods of operating the semiconductor devices.

According to an example embodiment, a method of operating a semiconductor device including a variable resistance device includes writing first data to the semiconductor device by applying a reset pulse voltage to the variable resistance device so that the variable resistance device is switched from a first resistance state to a second resistance state and writing second data to the semiconductor device by applying a set pulse voltage to the variable resistance device so that the variable resistance device is switched from the second resistance state to the first resistance state, the reset pulse voltage being higher than the set pulse voltage, and a resistance in the second resistance state being greater than in the first resistance state.

The reset pulse voltage may be two times or higher than the set pulse voltage. A polarity of the reset pulse voltage may be different from that of the set pulse voltage. The writing of the first data may include applying the reset pulse voltage to the variable resistance device at least two times. A resistance in the second resistance state may be about 20 to about 100 times higher than in the first resistance state.

The writing of the first data may include writing the first data to the semiconductor device by applying the reset pulse voltage to the variable resistance device so that the variable resistance device is switched from the first resistance state to the second resistance state, and then applying an additional reset pulse voltage to the variable resistance device so that the variable resistance device is switched from the second resistance state to a third resistance state. A resistance in the third resistance state may be greater than in the second resistance state.

A polarity of the reset pulse voltage may be different from that of the set pulse voltage, and a polarity of the additional reset pulse voltage is the same as the polarity of the set pulse voltage. The reset pulse voltage may be higher than the set pulse voltage, and the additional reset pulse voltage may be lower than the set pulse voltage.

The writing of the first data may include applying the reset pulse voltage or the additional reset pulse voltage to the variable resistance device at least two times. The writing of the first data may include applying the reset pulse voltage to the variable resistance device at least two times, and then applying the additional reset pulse voltage to the variable resistance device at least two times. The writing of the first data may include alternately and repeatedly applying the reset pulse voltage and the additional reset pulse voltage to the variable resistance device. According to example embodiments, the reset pulse voltage and the additional reset pulse voltage may be consecutively applied a plurality of times. The resistance in the third resistance state may be about 20 to about 1000 times higher than in the first resistance state.

According to another example embodiment, a method of operating a semiconductor device that includes a variable resistance device includes writing first data to the semiconductor device by continuously applying a first reset pulse voltage and a second reset voltage to the variable resistance device so that the variable resistance device is reset and writing second data to the semiconductor device by applying a set pulse voltage to the variable resistance device so that the variable resistance device is set, the variable resistance device being switched from a first resistance state to a second resistance state when the first reset pulse voltage is applied to the variable resistance device, being switched from the second resistance state to a third resistance state when the second reset pulse voltage is applied to the variable resistance device, and being switched from the third resistance state to the first resistance state when the set pulse voltage is applied to the variable resistance device, a resistance in the third resistance state is greater than a resistance in the second resistance state, and the resistance in the second resistance state is greater than a resistance in the first resistance state.

A polarity of the first reset pulse voltage may be different from that of the set pulse voltage, and a polarity of the second reset pulse voltage may be the same as the polarity of the set pulse voltage. The first reset pulse voltage may be higher than the set pulse voltage and the second reset pulse voltage may be lower than the set pulse voltage. The writing of the first data may include applying the first reset pulse voltage or the second reset pulse voltage to the variable resistance device at least two times. The writing of the first data may include applying the first reset pulse voltage to the variable resistance device at least two times, and then applying the second reset pulse voltage to the variable resistance device at least two times. The writing of the first data may include alternately and repeatedly applying the first reset pulse voltage and the second reset pulse voltage to the variable resistance device. For example, the first reset pulse voltage and the second reset pulse voltage may be consecutively applied a plurality of times. The resistance in the third resistance state may be about 20 to about 1000 times higher than in the first resistance state.

According to another example embodiment, a variable resistance device includes a first electrode a second electrode and a variable resistance material layer disposed between the first and second electrodes, the variable resistance material layer being switched from a first resistance state to a second resistance state when a first reset pulse voltage is applied between the first and second electrodes, being switched from the second resistance state to a third resistance state when a second reset pulse voltage is applied between the first and second electrodes, and being switched from the third resistance state to the first resistance state when a set pulse voltage is applied between the first and second electrodes, a resistance in the third resistance state being greater than a resistance in the second resistance state, and the resistance in the second resistance state being greater than a resistance in the first resistance state.

The first reset pulse voltage may be about two times higher than the set pulse voltage. A polarity of the first reset pulse voltage may be different from that of the set pulse voltage and a polarity of the second reset pulse voltage may be the same as the polarity of the set pulse voltage. The first reset pulse voltage may be higher than the set pulse voltage, and the second reset pulse voltage may be lower than the set pulse voltage.

According to another example embodiment, a semiconductor device includes a variable resistance device that is switched from a first resistance state to a second resistance state when a first reset pulse voltage is applied to the variable resistance device, is switched from the second resistance state to a third resistance state when a second reset pulse voltage is applied to the variable resistance device, and is switched from the third resistance state to the first resistance state when a set pulse voltage is applied to the variable resistance device and a selection device connected in series to the variable resistance device, a resistance in the third resistance state being greater than a resistance in the second resistance state, and the resistance in the second resistance state being greater than a resistance in the first resistance state.

The first reset pulse voltage may be about two times higher than the set pulse voltage. A polarity of the first reset pulse voltage may be different from that of the set pulse voltage, and a polarity of the second reset pulse voltage may be the same as the polarity of the set pulse voltage. The first reset pulse voltage may be higher than the set pulse voltage, and the second reset pulse voltage may be lower than the set pulse voltage. First data may be written to the semiconductor device when the first and second reset pulse voltages are continuously applied to the variable resistance device, and second data may be written to the semiconductor device when the set pulse voltage is applied to the variable resistance device. The selection device may be a transistor or a diode.

According to an example embodiment, a method of operating a semiconductor device includes writing first data by applying at least one reset pulse voltage to switch a variable resistance device from a first resistance to a second resistance, the second resistance greater than the first resistance and writing second data by applying at least one set pulse voltage to switch the variable resistance device from the second resistance to the first resistance, a magnitude of the at least one set pulse voltage less than a magnitude of the at least one reset pulse voltage.

According to an example embodiment, a method of operating a semiconductor device includes writing first data by consecutively applying at least one first reset pulse voltage and at least one second reset pulse voltage to reset a variable resistance device, the application of the at least one first reset voltage switching the variable resistance device from a first resistance state to a second resistance state, and the application of the at least one second reset voltage switching the variable resistance device from the second resistance state to a third resistance state, a resistance of the third resistance state greater than a resistance of the second resistance state and writing second data by applying at least one set pulse voltage to set the variable resistance device, the application of the at least one set pulse voltage switching the variable resistance device from the third resistance state to the first resistance state, the resistance of the second resistance state greater than a resistance of the first resistance state.

According to example embodiments, a semiconductor device includes a first electrode, a second electrode and a variable resistance material layer between the first and second electrodes, the variable resistance material layer configured to switch from a first resistance to a second resistance upon application of a first reset pulse voltage, to switch from the second resistance to a third resistance upon application of a second reset pulse voltage, and to switch from the third resistance to the first resistance upon application of a set pulse voltage, the third resistance greater than the second resistance and the second resistance greater than the first resistance.

According to example embodiments, a semiconductor device includes a variable resistance device configured to be switched from a first resistance state to a second resistance state upon application of a first reset pulse voltage, to be switched from the second resistance state to a third resistance state upon application of a second reset pulse voltage, and to be switched from the third resistance state to the first resistance state upon application of a set pulse, a resistance in the third resistance state greater than a resistance in the second resistance state, and the resistance in the second resistance state greater than a resistance in the first resistance state and a selection device connected in series to the variable resistance device.

BRIEF DESCRIPTION OF THE DRAWINGS

Example embodiments will be more clearly understood from the following brief description taken in conjunction with the accompanying drawings.

FIG. 1 is a schematic cross-sectional diagram of a variable resistance device according to example embodiments;

FIG. 2 is a graph illustrating ideal current-voltage characteristics of the variable resistance device of FIG. 1;

FIG. 3 is a graph illustrating representative current-voltage characteristics of the variable resistance device of FIG. 1;

FIG. 4 is a graph illustrating example operating pulse voltages applied to the variable resistance device of FIG. 1;

FIG. 5 is a graph illustrating variation in current flowing through the variable resistance device of FIG. 1 when the operating pulse voltages of FIG. 4 are applied to the variable resistance device;

FIG. 6 is a graph schematically illustrating a distribution of resistances of the variable resistance device of FIG. 1 when the operating pulse voltages of FIG. 4 are applied to the variable resistance device;

FIG. 7 is a graph illustrating example operating pulse voltages applied to the variable resistance device of FIG. 1;

FIG. 8 is a graph illustrating variation in current flowing through the variable resistance device of FIG. 1 when the operating pulse voltages of FIG. 7 are applied to the variable resistance device;

FIG. 9 is a graph illustrating example operating pulse voltages applied to the variable resistance device of FIG. 1;

FIG. 10 is a graph illustrating variation in current flowing through the variable resistance device of FIG. 1 when the operating pulse voltages of FIG. 9 are applied to the variable resistance device;

FIG. 11 is a graph illustrating variation in resistance of the variable resistance device of FIG. 1 when the operating pulse voltages of FIG. 9 are applied to the variable resistance device;

FIG. 12 is a graph schematically illustrating a distribution of resistances of the variable resistance device of FIG. 1 when the operating pulse voltages of FIG. 9 are applied to the variable resistance device;

FIG. 13 is a circuit diagram of a semiconductor device including the variable resistance device of FIG. 1 according to example embodiments;

FIG. 14 is a circuit diagram of a semiconductor device including the variable resistance device of FIG. 1 according to example embodiments;

FIG. 15 is a cross-sectional diagram of the semiconductor device of FIG. 14;

FIG. 16 is a flowchart illustrating a method of operating a semiconductor device according to example embodiments;

FIG. 17 is a schematic block diagram of a memory card according to example embodiments; and FIG. 18 is a schematic block diagram of an electronic system according to example embodiments.

Figure 1:
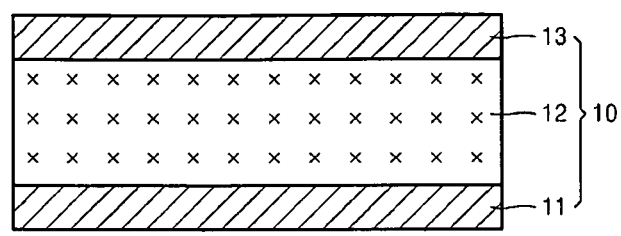
FIGS. 1-18 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional diagram of a variable resistance device 10 according to example embodiments. Referring to FIG. 1, the variable resistance device 10 may include a first electrode 11, a variable resistance material layer 12 and a second electrode 13. The variable resistance material layer 12 may be between the first electrode 11 and the second electrode 13. According to other example embodiments, the variable resistance device 10 may further include a buffer layer (not shown) on the first electrode 11 and/or on the variable resistance material layer 12.

The first electrode 11 and the second electrode 13 may each be a conductive material, for example, an oxidation resistant metal layer and/or a polysilicon layer. For example, the oxidation resistant metal layer may be iridium (Ir), platinum (Pt), an iridium oxide (IrO), a titanium nitride (TiN), a titanium aluminum nitride (TiAlN), tungsten (W), molybdenum (Mo), ruthenium (Ru) and/or a ruthenium oxide (RuO). The oxidation resistant metal layer may be, for example, formed after the buffer layer is formed. According to example embodiments, the first electrode 11 and the second electrode 13 may be located above and below the variable resistance material layer 12, respectively, but example embodiments are not limited thereto. According to other example embodiments, the first electrode 11 and the second electrode 13 may be located on sides of the variable resistance material layer 12.

The variable resistance material layer 12 may include a perovskite-based oxide and/or a transition metal oxide. Examples of the perovskite-based oxide include $Pr_{1-x}Ca_xMnO_3$, $La_{1-x}Ca_xMnO_3$, $SrZrO_3/SrTiO_3$, $CrTiO_3$, $Pb(Zr,Ti)O_3/Zn_{1-x}Cd_xS$, and/or the like. Examples of transition metals include nickel, niobium, titanium, zirconium, hafnium, cobalt, iron, copper, manganese, zinc, chrome, and/or the like. A resistance of the variable resistance material layer 12 may vary according to a difference between voltages applied to the first electrode 11 and the second electrode 13. A resistance state of the variable resistance material layer 12 may be classified as a high resistance state or a low resistance state according to the resistance thereof.

The variable resistance device 10 may be used as a semiconductor device, for example, as a non-volatile memory device, which stores data '0' or '1' according to a resistance state of the variable resistance material layer 12. The variable resistance device 10 may be included into a logic gate so as to be used in a logic circuit. In this case, the size of the logic circuit may be reduced, thereby improving the integration degree of an entire device.

Example embodiments are described such that data '0' and data '1' may denote a high resistance state and a low resistance state of a variable resistance material layer 12, respectively. In this case, writing data '0' to the variable resistance device 10 may be referred to as an erase operation and/or a reset operation, and writing data '1' to the variable resistance device 10 may be referred to as a program operation and/or a set operation. Example embodiments are not so limited and data '1' and data '0' may correspond to a high resistance state and a low resistance state of a variable resistance material layer 12, respectively.

Figure 2:
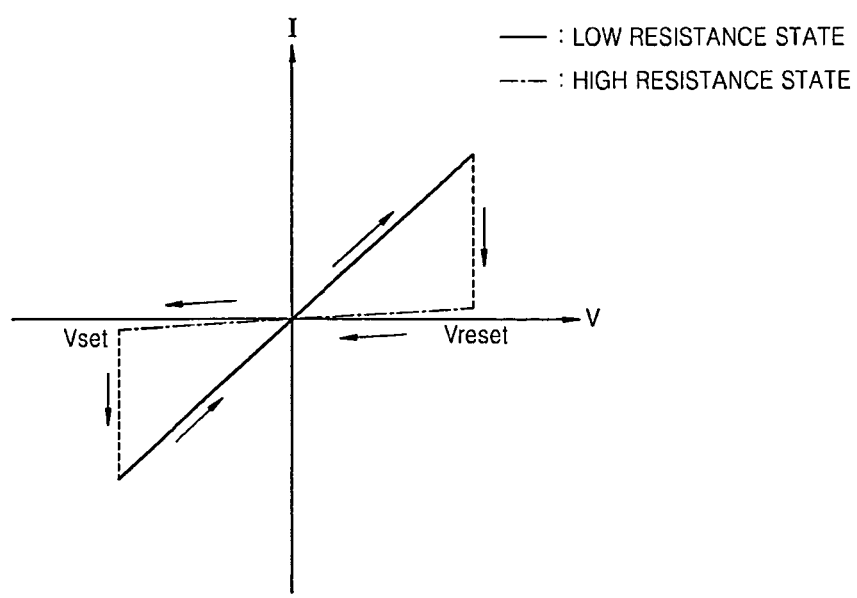

FIG. 2 is a graph illustrating ideal current-voltage characteristics of the variable resistance device 10 of FIG. 1. Referring to FIG. 2, the X-axis may denote voltage and the Y-axis may denote current according to a linear scale. Voltages depicted on the X-axis may denote the differences between the voltages applied to the first and second electrodes 11 and 13 of the variable resistance device 10, and more particularly, values obtained by subtracting voltages applied to the first electrode 11 from voltages applied to the second electrode 13.

The variable resistance device 10 may be switched from a low resistance state to a high resistance state by applying a positive threshold voltage thereto. In a high resistance state relatively little current may flow through the variable resistance device 10. Switching the variable resistance device 10 from a low resistance state to a high resistance state may be referred to as 'resetting'. The 'positive threshold voltage' may be referred to as a 'reset voltage $V_{reset}$'. The variable resistance device 10 may be switched from a high resistance state to a low resistance state by applying a negative threshold voltage thereto. Switching of the variable resistance device 10 from a high resistance state to a low resistance state may be referred to as 'setting'. The 'negative threshold voltage' may be referred to as a 'set voltage $V_{set}$'.

Polarities of the reset voltage $V_{reset}$ and the set voltage $V_{set}$ may be opposite to each other. If the polarities of the reset voltage $V_{reset}$ and the set voltage $V_{set}$ of the variable resistance device 10 are opposite to each other the variable resistance device 10 may be referred to as a 'bipolar variable resistance device'. According to example embodiments, a reset voltage $V_{reset}$ applied to the variable resistance device 10 may have a positive value and a set voltage $V_{set}$ applied to the variable resistance device 10 may have a negative value. Example embodiments are not limited thereto and a reset voltage $V_{reset}$ may have a negative value and the set voltage $V_{set}$ may have a positive value according to the type of material used to form the variable resistance material layer 12 of the variable resistance device 10.

Figure 3:
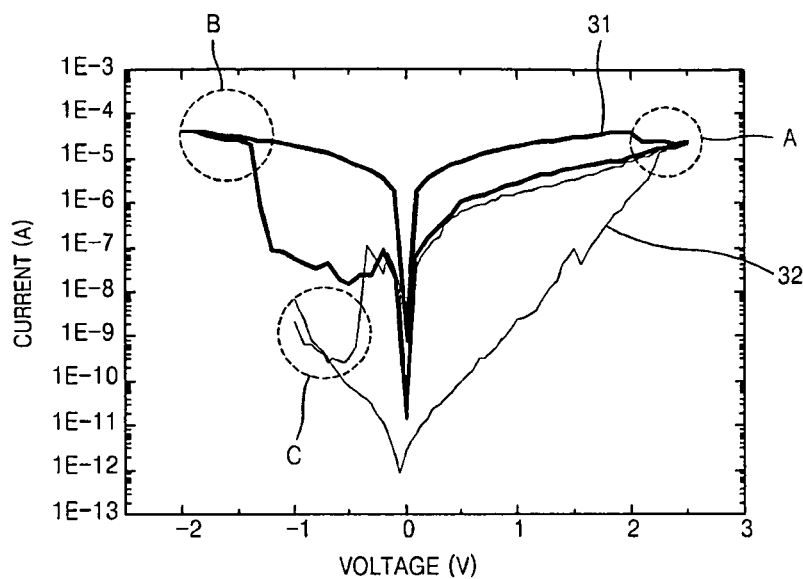

FIG. 3 is a graph illustrating representative current-voltage characteristics of the variable resistance device 10 of FIG. 1. Referring to FIG. 3, the X-axis may denote voltage and the Y-axis may denote current according to a log scale. Voltages depicted on the X-axis may denote differences between voltages applied to the first and second electrodes 11 and 13 of the variable resistance device 10, and more particularly, values obtained by subtracting voltages applied to the first electrode 11 from voltages applied to the second electrode 13, respectively. Reference numeral 31 may illustrate variation in current flowing through the variable resistance device 10 when a voltage applied to the variable resistance device 10 is varied in intervals of 100 mV and each voltage is applied to the variable resistance device 10 for a first period of time. Reference numeral 32 may show variation in current flowing through the variable resistance device 10 when a voltage applied to the variable resistance device 10 is varied in intervals of 50 mV and each voltage is applied to the variable resistance device 10 for a second period of time that is longer than the first period of time.

Reference numeral 31 may show that current in an A region decreases to about 1/10 times the maximum value thereof. The variable resistance device 10 may be switched from the low resistance state to a first high resistance state. A resistance in the first high resistance state may be higher than in the low resistance state. A voltage for switching the variable resistance device 10 from the low resistance state to the first high resistance state will be referred to as a 'first voltage'. According to example embodiments, the first voltage may be about 2 V. The first voltage may also be referred to as a 'reset voltage'.

Reference numeral 31 illustrates that the current increases in a B region. In this case, the variable resistance device 10 may be switched from the first high resistance state to the low resistance state. A voltage for switching the variable resistance device 10 from the first high resistance state to the low resistance state will be referred to as a 'second voltage'.

According to example embodiments, the second voltage may be about −1.5 V. The second voltage may also be referred to as a 'set voltage'.

Reference numeral 32 may show that the current in a C region decreases to about 1/100 times the maximum value thereof. In this case, the variable resistance device 10 may be switched from the first high resistance state to a second high resistance state. A resistance in the second high resistance state is greater than in the first high resistance state. A voltage for switching the variable resistance device 10 from the first high resistance state to the second high resistance state will be referred to as a 'third voltage'. According to example embodiments, the third voltage may be about −0.5 V.

According to example embodiments, the high resistance state of the variable resistance device 10 may be categorized into a first high resistance state and a second high resistance state. Accordingly, the variable resistance device 10 may have the low resistance state, the first high resistance state, and/or the second high resistance state according to a voltage applied thereto. For example, the resistance in the first high resistance state may be about ten times greater than in the low resistance state, and the resistance in the second high resistance state may be about thousands of times greater than in the low resistance state.

A reset pulse voltage for switching the variable resistance device 10 from a low resistance state to a high resistance state and a set pulse voltage for switching the variable resistance device 10 from a high resistance state to a low resistance state may be determined based on the current-voltage characteristics of the variable resistance device 10 illustrated in FIG. 3. If the reset pulse voltage is applied to the variable resistance device 10, then data '0' may be written to the variable resistance device 10 and/or the variable resistance device 10 may be erased. If the set pulse voltage is applied to the variable resistance device 10, then data '1' may be written to the variable resistance device 10 and/or the variable resistance device 10 may be programmed.

Figure 4:
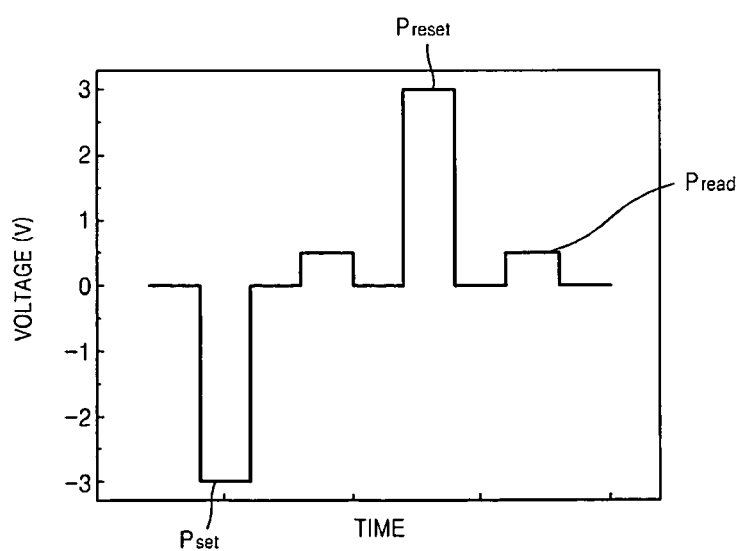

FIG. 4 is a graph illustrating example operating pulse voltages that may be applied to the variable resistance device 10 of FIG. 1. Referring to FIG. 4, the X-axis may denote time and the Y-axis may denote voltage. According to example embodiments illustrated in FIG. 4, a set pulse voltage $P_{set}$ may be about −3 V, a reset pulse voltage $P_{reset}$ may be about 3 V, and a read pulse voltage $P_{read}$ may be about 0.5 V. The pulse widths of the set pulse voltage $P_{set}$, the reset pulse voltage $P_{reset}$, reset, and the read pulse voltage $P_{read}$ may be different from one another. For example, the set pulse voltage $P_{set}$ may be applied for about 1 μs and the reset pulse voltage $P_{reset}$ may be applied for about 10 μs. The set pulse voltage $P_{set}$ and the reset pulse voltage $P_{reset}$ may be symmetrical to each other. Specifically, the set pulse voltage $P_{set}$ and the reset pulse voltage $P_{reset}$ may be the same in magnitude (e.g., the same absolute value of the voltage) but may be different in polarity.

The set pulse voltage $P_{set}$ may be determined based on the second voltage described above with reference to FIG. 3. The set pulse voltage $P_{set}$ may be equal to or greater than the second voltage and may have the same polarity as the second voltage. The reset pulse voltage $P_{reset}$ may be determined by the first voltage described above with reference to FIG. 3. The reset pulse voltage $P_{reset}$ may be equal to or greater than the first voltage and may have the same polarity as the first voltage.

Figure 5:
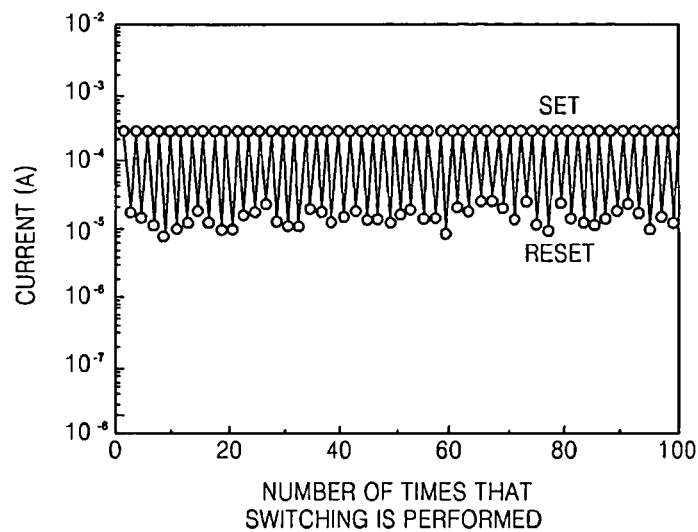

FIG. 5 is a graph illustrating variation in current flowing through the variable resistance device 10 of FIG. 1 when the operating pulse voltages of FIG. 4 are applied to the variable resistance device 10. Referring to FIG. 5, the X-axis may denote the number of times that switching is performed and the Y-axis may denote current according to a log scale. Switching may mean that a resistance of the variable resistance device 10 is changed, and particularly, that the variable resistance device 10 is switched from a low resistance state to a high resistance state or from a high resistance state to a low resistance state.

If a set pulse voltage $P_{set}$ is applied to the variable resistance device 10, the variable resistance device 10 may be switched from a high resistance state to a low resistance state (e.g., data '1' is considered as being written to the variable resistance device 10). The current flowing through the variable resistance device 10 may be about $10^{-4}$ A. If a reset pulse voltage $P_{reset}$ is applied to the variable resistance device 10, then the variable resistance device 10 may be switched from a low resistance state to a high resistance state (e.g., data '0' is considered as being written to the variable resistance device 10). The current flowing through the variable resistance device 10 may be about $10^{-5}$ A. If resistances of the variable resistance device 10 when the data '1' is written to the variable resistance device 10 and when the data '0' is written to the variable resistance device 10 are 'on' resistance and 'off' resistance, respectively, then the ratio of the 'on' resistance to the 'off' resistance is about 10.

Figure 6:
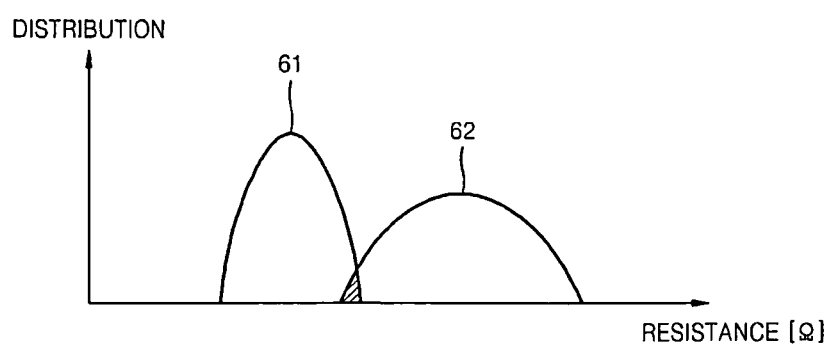

FIG. 6 is a graph schematically illustrating a distribution of resistances of the variable resistance device 10 of FIG. 1 when the operating pulse voltages of FIG. 4 are applied to the variable resistance device 10. Referring to FIG. 6, the X-axis may denote resistance and the Y-axis may denote a distribution of resistances for a variable resistance device 10. The variable resistance device 10 may have a low resistance state 61 and/or a high resistance state 62. According to example embodiments, the ratio of 'on' resistance to 'off' resistance is about 10. Some of the resistances of the variable resistance device 10 to which data '0' is written may be equal to some of the resistances of the variable resistance device 10 to which data '1' is written. Because the reliability of the variable resistance device 10 may not be guaranteed, it may be difficult to use the variable resistance device 10 in a semiconductor device, such as a non-volatile memory device.

Figure 7:
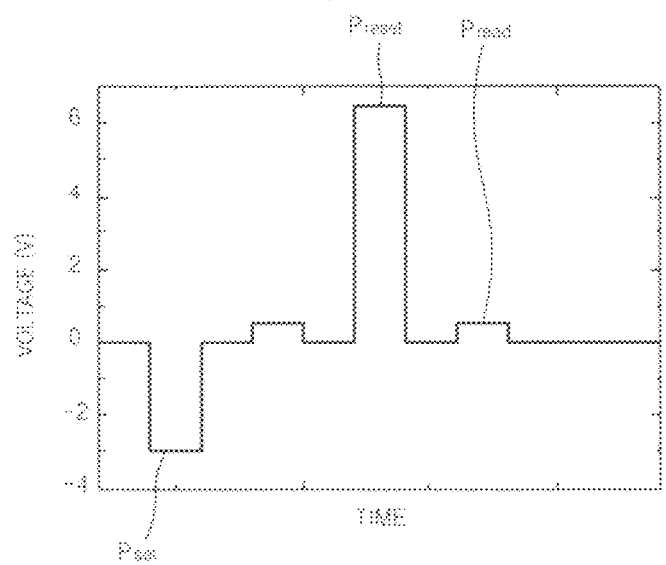

FIG. 7 is a graph illustrating example operating pulse voltages applied to the variable resistance device 10 of FIG. 1. Referring to FIG. 7, the X-axis may denote time and the Y-axis may denote voltage. According to example embodiments illustrated in FIG. 7, a set pulse voltage $P_{set}$ may be about −3 V, a reset pulse voltage $P_{reset}$ may be about 6.5 V, and a read pulse voltage $P_{read}$ may be about 0.5 V. The set pulse voltage $P_{set}$ and the reset pulse voltage $P_{reset}$ may be asymmetrical to each other. The reset pulse voltage $P_{reset}$ may be of greater magnitude than the set pulse voltage $P_{set}$ and may be different from the set pulse voltage $P_{set}$ in terms of polarity.

The set pulse voltage $P_{set}$ may be determined based on the second voltage described above with reference to FIG. 3. The set pulse voltage $P_{set}$ may be equal to or greater in magnitude than the second voltage and may have the same polarity as the second voltage. The reset pulse voltage $P_{reset}$ is determined based on the first voltage described above with reference to FIG. 3. The set pulse voltage $P_{set}$ may be equal to or greater in magnitude than the first voltage and may have the same polarity as the first voltage.

The reset pulse voltage $P_{reset}$ may be, for example, about 2 times greater than the first voltage. The reset pulse voltage $P_{reset}$ may be about 2 times greater than the set pulse voltage $P_{set}$. If the reset pulse voltage $P_{reset}$ is determined to be high as described above, then resetting may be performed quickly owing to oxygen diffusion occurring in the variable resistance material layer 12. The variable resistance device 10 may be switched quickly from the low resistance state to the high resistance state. According to other example embodiments, the reset pulse voltage $P_{reset}$ may be applied at least 2 times, and the read pulse voltage $P_{read}$ may be applied after the reset pulse voltage $P_{reset}$ is applied at least 2 times. According to still other example embodiments, the reset pulse voltage $P_{reset}$ and the set pulse voltage $P_{set}$ may be applied alternately and repeatedly. According to example embodiments, the reset pulse voltage $P_{reset}$ and the set pulse voltage $P_{set}$ may be applied consecutively a plurality of times.

Figure 8:
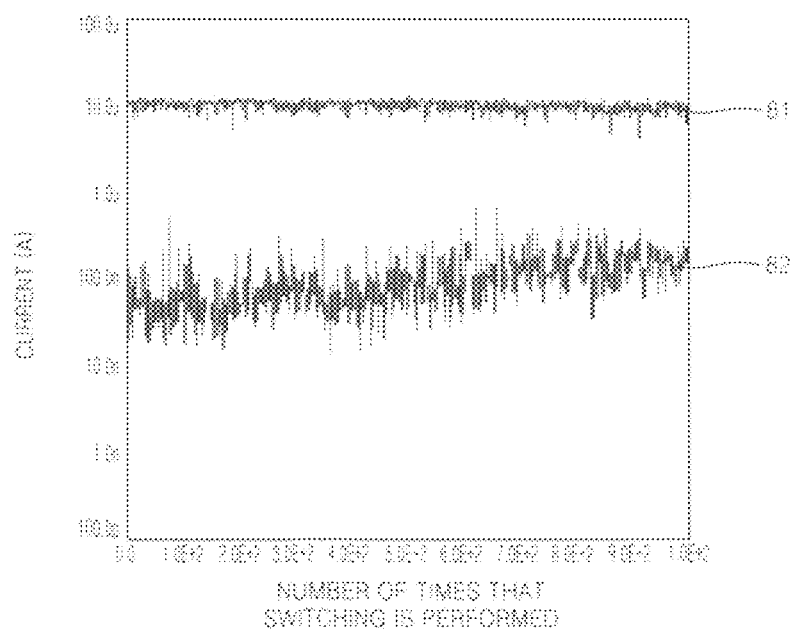

FIG. 8 is a graph illustrating variation in current flowing through the variable resistance device 10 of FIG. 1 when the operating pulse voltages of FIG. 7 are applied to the variable resistance device 10. Referring to FIG. 8, the X-axis may denote the number of times that switching is performed and the Y-axis may denote current according to a log scale. Reference numeral 81 may denote a low resistance state of the variable resistance device 10 of FIG. 1 and reference numeral 82 may denote a high resistance state of the variable resistance device 10. The current in the low resistance state may be about 20 to about 100 times greater than in the high resistance state. According to example embodiments, the difference between the resistances in the high resistance state and the low resistance state may be greater than when the current in the low resistance state is about 10 times greater than in the high resistance state (e.g., according to example embodiments described with reference to FIG. 5). The reliability of the variable resistance device 10 may be improved.

Figure 9:
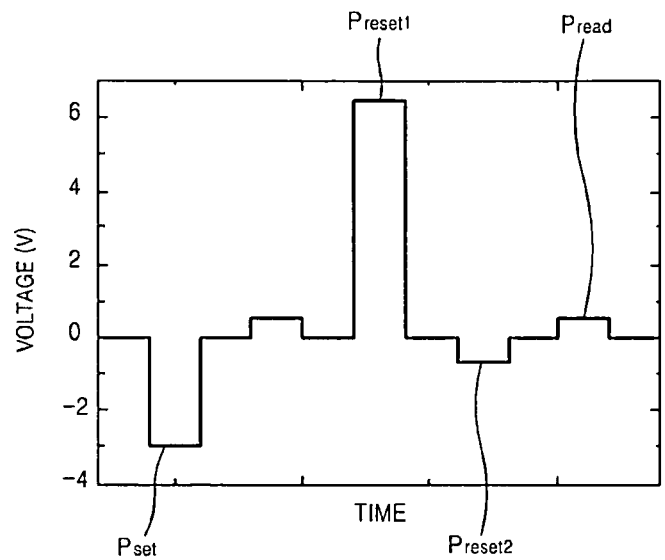

FIG. 9 is a graph illustrating example embodiments of operating pulse voltages applied to the variable resistance device 10 of FIG. 1. Referring to FIG. 9, the X-axis may denote time and the Y-axis may denote voltage. According to example embodiments illustrated in FIG. 9, a set pulse voltage $P_{set}$ may be about −3 V, a first reset pulse voltage $P_{reset1}$ may be about 6.5 V, a second reset pulse voltage $P_{reset2}$ may be about −0.6 V, and a read pulse voltage $P_{read}$ may be about 0.5 V. A reset pulse voltage may be categorized into a first reset pulse voltage $P_{reset1}$ and a second reset pulse voltage $P_{reset2}$, and the first and second reset pulse voltages $P_{reset1}$ and $P_{reset2}$ may be different in polarity.

The set pulse voltage $P_{set}$ and the first reset pulse voltage $P_{reset1}$ may be asymmetrical to each other. The first reset pulse voltage $P_{reset1}$ may be of a greater magnitude than the set pulse voltage $P_{set}$, and the set pulse voltage $P_{set}$ and the first reset pulse voltage $P_{reset1}$ may be different in polarity. The second reset pulse voltage $P_{reset2}$ may be of a lesser magnitude than the set pulse voltage $P_{set}$ and may have the same polarity as the set pulse voltage $P_{set}$.

The set pulse voltage $P_{set}$ may be determined based on the second voltage described above with reference to FIG. 3. The set pulse voltage $P_{set}$ may be equal to or greater than the second voltage and may have the same polarity as the second voltage. The first reset pulse voltage $P_{reset1}$ may be determined based on the first voltage described above with reference to FIG. 3. The first reset pulse voltage $P_{reset1}$ may be equal to or greater in magnitude than the first voltage and may have the same polarity as the first voltage. According to example embodiments described with respect to FIG. 9, the first reset pulse voltage $P_{reset1}$ may be about 2 times greater than the first voltage. The first reset pulse voltage $P_{reset1}$ may be about 2 times greater than the set pulse voltage $P_{set}$. If the first reset pulse voltage $P_{reset1}$ is determined to be high as described above, then resetting may be performed quickly owing to oxygen diffusion occurring in the variable resistance material layer 12. The variable resistance device 10 may be switched quickly from a low resistance state to a high resistance state.

The second reset pulse voltage $P_{reset2}$ may be determined based on the third voltage described above with reference to FIG. 3. The second reset pulse voltage $P_{reset2}$ may be equal to or greater in magnitude than the third voltage and may have the same polarity as the third voltage. According to example embodiments, the second reset pulse voltage $P_{reset2}$ may be determined to be similar to the third voltage. According to example embodiments described with respect to FIG. 3, the variable resistance device 10 may have the second high resistance state when a voltage applied thereto is from about −0.5 V to about −1.2 V. The second reset pulse voltage $P_{reset2}$ may range from about −0.5 V to about −1.2 V.

According to other example embodiments, the second reset pulse voltage $P_{reset2}$ may be applied at least 2 times, and the read pulse voltage $P_{read}$ may be applied after the second reset pulse voltage $P_{reset2}$ is applied at least 2 times. According to still other example embodiments, the first reset pulse voltage $P_{reset1}$ may be applied at least 2 times, the second reset pulse voltage $P_{reset2}$ may be applied at least 2 times after the first reset pulse voltage $P_{reset1}$ applied at least 2 times, and the read pulse voltage $P_{read}$ may be applied after the second reset pulse voltage $P_{reset2}$ is applied at least 2 times. According to further example embodiments, the first reset pulse voltage $P_{reset1}$ and the second reset pulse voltage $P_{reset2}$ may be applied alternately and repeatedly. According to example embodiments, the reset pulse voltage $P_{reset}$ and the set pulse voltage $P_{set}$ may be applied consecutively a plurality of times.

Figure 10:
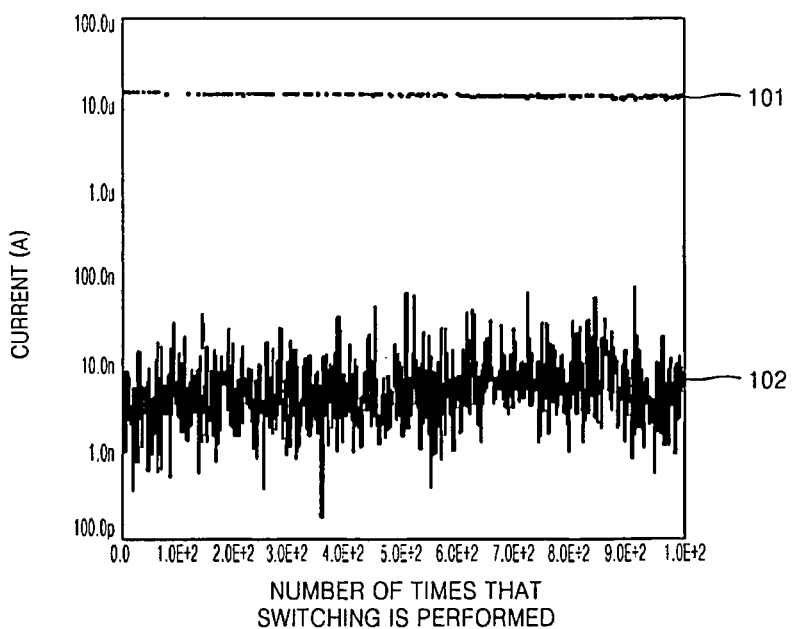

FIG. 10 is a graph illustrating variation in current flowing through the variable resistance device 10 of FIG. 1 when the operating pulse voltages of FIG. 9 are applied to the variable resistance device 10. Referring to FIG. 10, the X-axis may denote a number of times that switching is performed and the Y-axis may denote current according to a log scale. Reference numeral 101 may denote a low resistance state of the variable resistance device 10 and reference numeral 102 may denote a high resistance state of the variable resistance device 10. Current in the low resistance state may be about 20 to about 1000 times greater than in the high resistance state. According to example embodiments described with respect to FIG. 10, the difference between resistances in the high resistance state and the low resistance state may be greater than when the current in the low resistance state is about 10 times higher than in the high resistance state according to example embodiments described with respect to FIG. 5 and than when the current in the low resistance state is about 100 times higher than in the high resistance state according to example embodiments described with respect to FIG. 8. The reliability of the variable resistance device 10 may be improved.

Figure 11:
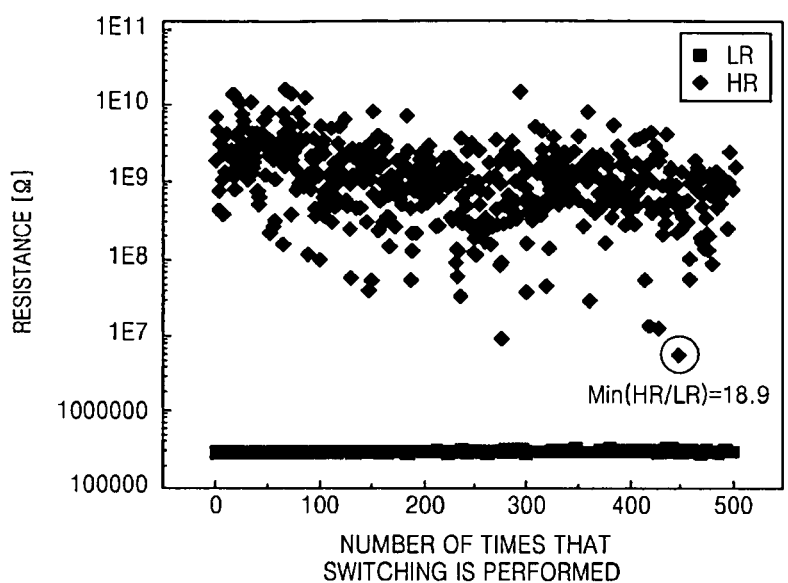

FIG. 11 is a graph showing variation in resistance of the variable resistance device 10 of FIG. 1 when the operating pulse voltages of FIG. 9 are applied to the variable resistance device 10. Referring to FIG. 11, the X-axis may denote a number of times that switching is performed and the Y-axis may denote current according to a log scale. Reference character ■ may denote a low resistance state of the variable resistance device 10 and reference character ♦ may denote a high resistance state of the variable resistance device 10. A resistance in the high resistance state may be about 1000 times higher than in the low resistance state. A minimum resistance in the high resistance state may be about 18.9 times that of the low resistance state. According to example embodiments described with respect to FIG. 9, the difference between resistances in the high resistance state and the low resistance state when a set pulse voltage and a first reset pulse voltage are applied to be asymmetrical to each other and a second reset voltage is further applied, may be greater than when a set pulse voltage and a reset pulse voltage are applied to be symmetrical to each other as illustrated in FIG. 4.

Figure 12:
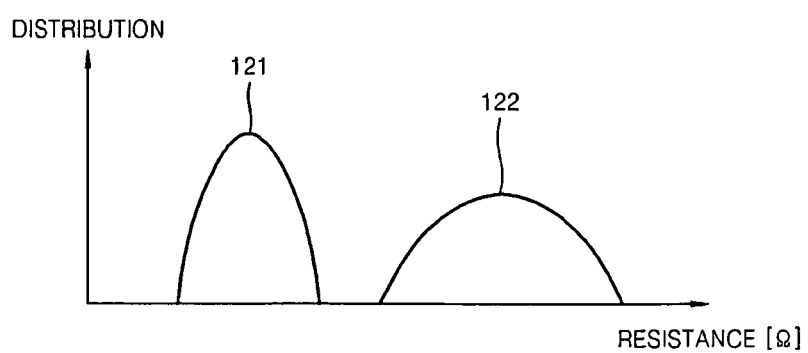

FIG. 12 is a graph schematically illustrating a distribution of resistances of the variable resistance device 10 of FIG. 1 when the operating pulse voltages of FIG. 9 are applied to the variable resistance device 10. Referring to FIG. 12, the X-axis may denote resistance and the Y-axis may denote a distribution of resistances for a variable resistance device 10. The variable resistance device 10 may have a low resistance state 121 and/or a high resistance state 122. According to example embodiments, the ratio of 'on' resistance to 'off' resistance may be about 1000. A possibility that some of the resistances of the variable resistance device 10 to which data '0' is written are equal to some of the resistances of the variable resistance device 10 to which data '1' is written may be low. Because the reliability of the variable resistance device 10 may be guaranteed, the variable resistance device 10 may be used in a semiconductor device, such as a non-volatile memory device. If the variable resistance device 10 is used in a non-volatile memory device, a bit error rate of the non-volatile memory device may be reduced.

Figure 13:
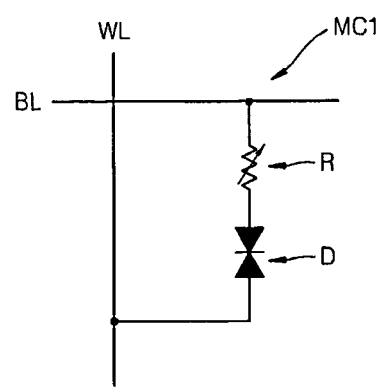

FIG. 13 is a circuit diagram of a semiconductor device including the variable resistance device 10 of FIG. 1 according to example embodiments. Referring to FIG. 13, the semiconductor device may be, for example, a non-volatile memory device, and a unit cell MC1 of the non-volatile memory device may include a variable resistor R and a diode D. The variable resistor R may be the variable resistance device 10 of FIG. 1. A first terminal of the variable resistor R may be connected to a bit line BL and a second terminal thereof may be connected to the diode D. The diode D may operate bi-directionally and may select the unit cell MC1 according to a voltage applied to a word line WL.

Figure 14:
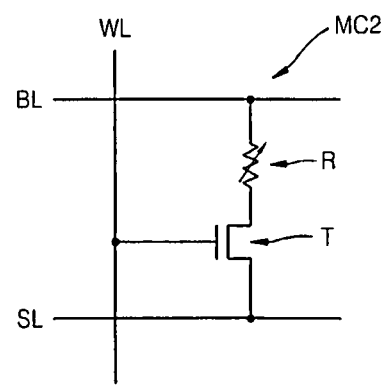

FIG. 14 is a circuit diagram of a semiconductor device including the variable resistance device 10 of FIG. 1 according to example embodiments. Referring to FIG. 14, the semiconductor device may be, for example, a non-volatile memory device, and a unit cell MC2 of the non-volatile memory device may include a variable resistor R and an access transistor T. The variable resistor R may be the variable resistance device 10 of FIG. 1. A first terminal of the variable resistor R may be connected to a bit line BL and a second terminal thereof may be connected to the access transistor T. The access transistor T may include a gate connected to a word line WL, a drain connected to the second terminal of the variable resistor R, and a source connected to a source line SL. The access transistor T may be switched on or off to select the unit cell MC2 according to a voltage applied to the word line WL.

Figure 15:
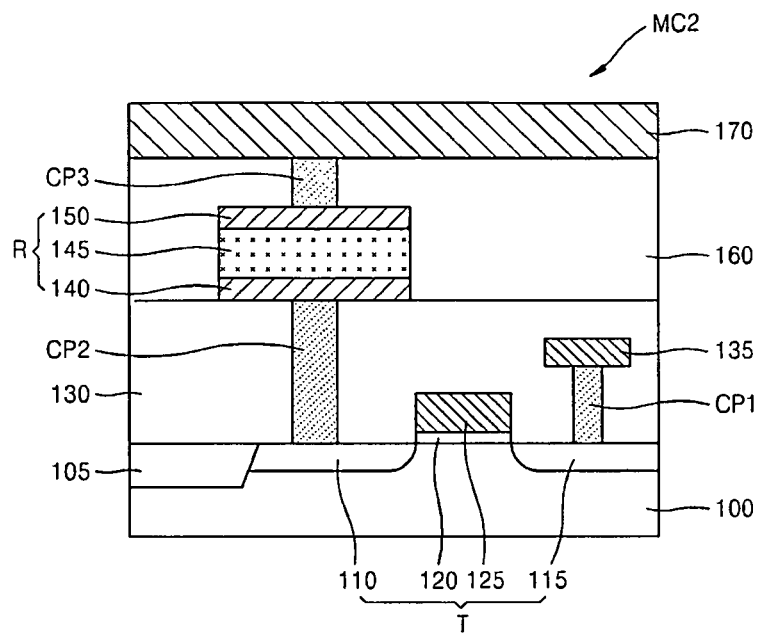

FIG. 15 is a cross-sectional diagram of the semiconductor device of FIG. 14. Referring to FIG. 15, an isolation layer 105 may be in a region of a semiconductor substrate 100 so as to define an active region. A drain region 110 and a source region 115 may be separated in the active region. A gate insulating layer 120 may be disposed on the active region between the drain region 110 and the source region 115, and a gate electrode 125 may be disposed on the gate insulating layer 120. The gate electrode 125 may extend to act as a word line and/or may be connected to a word line (not shown). The gate electrode 125, the drain region 110, and the source region 115 may be part of an access transistor T.

A first interlayer insulating layer 130 may be on the access transistor T. A first contact plug CP1 and a second contact plug CP2 may be in the first interlayer insulating layer 130. The source region 115 may be connected to a source line 135 via the first contact plug CP1. The drain region 110 may be connected to a lower electrode 140 via the second contact plug CP2.

A second interlayer insulating layer 160 may be on the first interlayer insulating layer 130. The lower electrode 140, a variable resistance material layer 145, and an upper electrode 150 may be stacked in a region of the second interlayer insulating layer 160. The upper electrode 150 may be connected to a bit line 170 via a third contact plug CP3. The lower electrode 140, the variable resistance material layer 145, and the upper electrode 150 may be at least part of a variable resistor R. The variable resistor R may be a variable resistance device 10.

According to example embodiments, if a first reset pulse voltage with a magnitude equal to or greater than a magnitude of a reset voltage is applied to a variable resistor R, then the variable resistor R may be switched from a low resistance state to a high resistance state and data '0' may be written to the non-volatile memory device. If a set pulse voltage with a magnitude that is equal to or greater than a magnitude of a set voltage is applied to the variable resistor R, then the variable resistor R may be switched from the high resistance state to the low resistance state and data '1' may be written to the non-volatile memory device. A resistance of the high resistance state may be about 20 to about 100 times greater than in the low resistance state.

According to other example embodiments, if a first reset pulse voltage and a second reset pulse voltage are applied sequentially to the variable resistor R, then the variable resistor R may be switched from a low resistance state to a high resistance state and data '0' may be written to the non-volatile memory device. If a set pulse voltage of a magnitude that is equal to or greater than a magnitude of a set voltage is applied to the variable resistor R, then the variable resistor R may be switched from the high resistance state to the low resistance state and data '1' may be written to the non-volatile memory device. The polarity of the second reset pulse voltage may be, for example, different from that of the first reset pulse voltage and may be the same as that of the set pulse voltage. The voltage of the second reset pulse voltage may be of lesser magnitude than the set pulse voltage. A resistance of the high resistance state may be about 20 to about 1000 times greater than in the low resistance state.

Figure 16:
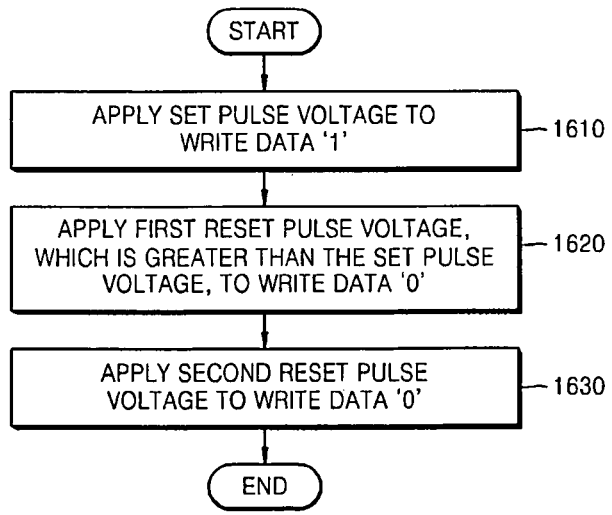

FIG. 16 is a flowchart illustrating methods of operating a semiconductor device according to example embodiments. Referring to FIG. 16, the semiconductor device may be, for example, a non-volatile memory device, and the method of operating the non-volatile memory device may correspond to a programming/erasing method that may be performed on one of the non-volatile memory devices illustrated in FIGS. 13 and 14, according to a resistance thereof. Each of the non-volatile memory devices illustrated in FIGS. 13 and 14 may include a variable resistance device 10 of FIG. 1. The example embodiments described above with reference to FIGS. 1-15 may also be applied to example embodiments described with reference to FIG. 16.

Referring to FIG. 16, in operation 1610, a set pulse voltage may be applied to a variable resistance device so as to write data '1' to the non-volatile memory device. The magnitude of the set pulse voltage may be equal to or greater than a magnitude of a set voltage and may have the same polarity as the set voltage. For example, the set voltage may be the second voltage described above with reference to FIG. 3. If the set pulse voltage is applied to the variable resistance device, the variable resistance device may be switched from the high resistance state to the low resistance state and data '1' may be written to the non-volatile memory device. The non-volatile memory device may be programmed.

In operation 1620, a first reset pulse voltage with a greater magnitude than the set pulse voltage may be applied to the variable resistance device so as to write data '0' to the non-volatile memory device. A magnitude of the first reset pulse voltage may be equal to or greater than a magnitude of a reset voltage and may have the same polarity as the reset voltage. A magnitude of the first reset pulse voltage may be about 2 times greater than a magnitude of the reset voltage. The magnitude of the first reset pulse voltage may be about 2 times greater than the magnitude of the set pulse voltage. For example, the reset voltage may be the first voltage described above with reference to FIG. 3. If the first reset pulse voltage is applied to the variable resistance device, the variable resistance device may be switched from the low resistance state to the high resistance state and data '0' may be written to the non-volatile memory device. The non-volatile memory device may be erased.

The set pulse voltage and the first reset pulse voltage that are asymmetrical to each other may be used so as to increase the difference between resistances in the low resistance state and the high resistance state, thereby improving the reliability of the variable resistance device.

In operation 1630, a second reset pulse voltage may be applied to the variable resistance device so as to write data '0' to the non-volatile memory device. The second reset pulse voltage may have different polarity from that of the first reset pulse voltage, that is, may have the same polarity as the set pulse voltage. The second reset pulse voltage may be of a magnitude that is less than a magnitude of the set pulse voltage. For example, the second reset pulse voltage may be determined based on the third voltage described above with reference to FIG. 3. If the second reset pulse voltage is applied to the variable resistance device, then the variable resistance device may be switched from the high resistance state to an ultra-high resistance state. A resistance in the ultra-high resistance state may be greater than in the high resistance state. Operation 1630 may be selectively performed.

The first and second reset pulse voltages may be applied sequentially so as to greatly increase the difference between the resistances in the low resistance state and the high resistance state, thereby improving the reliability of the variable resistance device. Even if operation 1630 is skipped and only operations 1610 and 1620 are performed, the difference between the resistances in the low resistance state and the high resistance state may be greater than in a general variable resistance device.

In the current embodiment, data '0' is written to the non-volatile memory device when the reset pulse voltage is applied to the variable resistance device and data '1' is written to the non-volatile memory device when the set pulse voltage is applied to the variable resistance device. However, according to other example embodiments, data '0' may be written to the non-volatile memory device when the set pulse voltage is applied to the variable resistance device and data '1' may be written to the non-volatile memory device when the reset pulse voltage is applied to the variable resistance device.

As described with respect to FIGS. 13-16, a non-volatile memory device is described as an example of a semiconductor device that includes a variable resistance device according to example embodiments. However, a variable resistance device according to example embodiments may be included in a logic gate so as to be used in a logic circuit. In this case, the size of the logic circuit may be reduced, thereby improving an integration degree of an entire device. For example, a variable resistance device according to example embodiments may be applied to a memristor. The memristor may operate according to a similar method as the method of operating a semiconductor device described with respect to FIG. 16. A "memristor" may be a device, in which, for example, the direction and amount of current are stored and a resistance varies according to the stored direction and amount of current.

Figure 17:
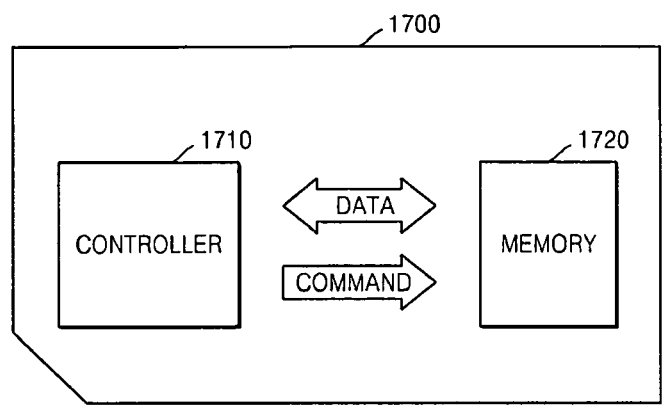

FIG. 17 is a schematic block diagram of a memory card 1700 according to example embodiments. Referring to FIG. 17, a memory card 1700 may include a controller 1710 and a memory unit 1720. The controller 1710 and the memory unit 1720 may be disposed to exchange electrical signals with each other. For example, if the controller 170 provides a command to the memory unit 1720, then the memory unit 1720 may transmit data to the controller 1710. The memory unit 1720 may include a non-volatile memory device that includes a variable resistance device according to example embodiments illustrated in FIGS. 1-16.

The memory card 1700 may be employed, for example, as a memory device including one of various types of cards (e.g., a memory stick card, a smart media (SM) card, a secure digital (SD) card, a mini SD card, and/or a multi-media card (MMC)).

Figure 18:
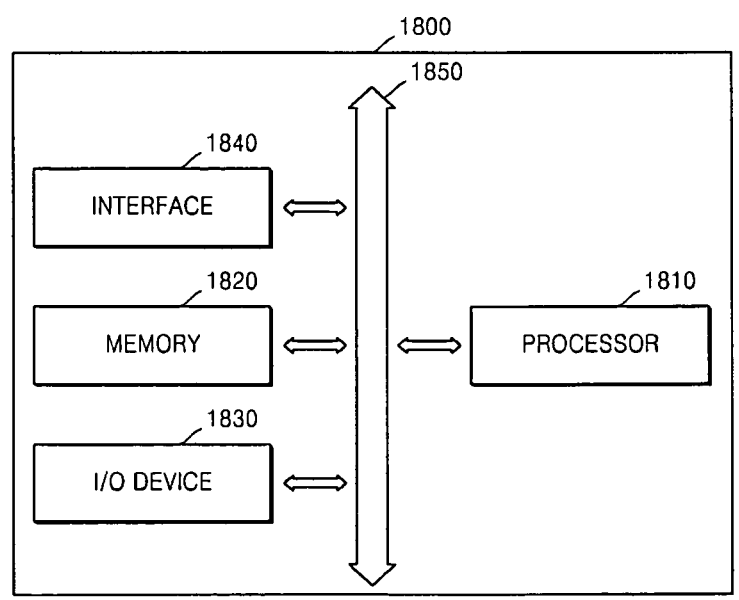

FIG. 18 is a schematic block diagram of an electronic system 1800 according to example embodiments. Referring to FIG. 18, the electronic system 1800 may include a processor 1810, a memory unit 1820, an input/output (I/O) device 1830, and an interface unit 1840. The electronic system 1800 may be, for example, a mobile system and/or a system capable of transmitting and receiving information. The mobile system may be, for example, a personal digital assistant (PDA), a portable computer, a web tablet, a wireless phone, a mobile phone, a digital music player, and/or a memory card. The processor 1810 may execute a program and control the electronic system 1800. The processor 1810 may be, for example, a microprocessor, a digital signal processor, a microcontroller, or the like.

The I/O device 1830 may be used to input data to or output data from the electronic system 1800. The electronic system 1800 may be connected to an external device (not shown) such as a personal computer (PC) and/or a network via the I/O device 1830 so as to exchange data with the external device. The I/O device 1830 may be, for example, a keypad, a keyboard, and/or a display. The memory unit 1820 may store code and/or data for operating the processor 1810, and/or may store data processed by the processor 1810. The memory unit 1820 may include a non-volatile memory device that includes a variable resistance device according to example embodiments illustrated in FIGS. 1-16. The interface unit 1840 may be used as a path via which the electronic system 1800 exchanges data with an external device (not shown). The processor 1810, the memory unit 1830, the I/O device 1830, and the interface unit 1840 may communicate with one another via a bus 1850.

The electronic system 1800 may be employed, for example, in a mobile phone, an MP3 player, a navigator, a portable multimedia player (PMP), a solid state drive (SSD), and/or household appliances.

According to one or more of the above example embodiments, a set pulse voltage and a reset pulse voltage may be asymmetrical to each other and may be used to improve the reliability of a semiconductor device including a variable resistance device. A bit error rate of the semiconductor device may be reduced. A difference between resistances in the high resistance state and the low resistance state may be increased by applying the reset pulse voltage of a greater magnitude than the set pulse voltage to the variable resistance device.

The difference between the resistances in the high resistance state and the low resistance state using a reset pulse of greater magnitude than the set pulse may be increased by sequentially applying a first reset pulse voltage and a second reset pulse voltage to the variable resistance device.

While example embodiments have been particularly shown and described, it will be understood by one of ordinary skill in the art that variations in form and detail may be made therein without departing from the spirit and scope of the claims.

What is claimed is:

1. A method of operating a semiconductor device, the method comprising:
    writing first data by applying at least one reset pulse voltage to switch a variable resistance device from a first resistance to a second resistance, the second resistance greater than the first resistance; and
    writing second data by applying at least one set pulse voltage to switch the variable resistance device from the second resistance to the first resistance, a magnitude of the at least one set pulse voltage less than a magnitude of the at least one reset pulse voltage,
    wherein the writing of the first data further includes applying at least one second reset pulse voltage after the applying of the at least one reset pulse voltage to switch the variable resistance device from the second resistance to a third resistance, and the third resistance is greater than the second resistance.

2. The method of claim 1, wherein the magnitude of the at least one reset pulse voltage is at least 2 times greater than the magnitude of the at least one set pulse voltage.

3. The method of claim 1, wherein a polarity of the at least one reset pulse voltage is different from a polarity of the at least one set pulse voltage.

4. The method of claim 1, wherein the at least one reset pulse voltage is a plurality of reset pulse voltages.

5. The method of claim 1, wherein the second resistance is about 20 to about 100 times greater than the first resistance.

6. The method of claim 1, wherein a polarity of the at least one reset pulse voltage is different from a polarity of the at least one set pulse voltage and the at least one second reset pulse voltage.

7. The method of claim 1, wherein the magnitude of the at least one set pulse voltage is greater than a magnitude of the at least one second reset pulse voltage.

8. The method of claim 1, wherein at least one of the at least one reset pulse voltage and the at least one second reset pulse voltage is a plurality of pulse voltages.

9. The method of claim 1, wherein the at least one reset pulse voltage is a plurality of reset pulse voltages, and the at least one second reset pulse voltage is a plurality of second reset pulse voltages.

10. The method of claim 1, wherein the writing of the first data further includes consecutively applying one third reset pulse voltage and one fourth reset pulse voltage after the applying of the at least one second reset pulse voltage,
    the third reset pulse voltage is a same magnitude and polarity as the at least one reset pulse voltage,
    the fourth reset pulse voltage is a same magnitude and polarity as the at least one second reset pulse voltage,
    the at least one reset pulse voltage is one reset pulse voltage, and
    the at least one second reset pulse voltage is one second reset pulse voltage.

11. The method of claim 1, wherein the third resistance is about 20 to about 1000 times greater than the first resistance.

12. A method of operating a semiconductor device, the method comprising:
    writing first data by consecutively applying at least one first reset pulse voltage and at least one second reset pulse voltage to reset a variable resistance device, the application of the at least one first reset voltage switching the variable resistance device from a first resistance state to a second resistance state, and the application of the at least one second reset voltage switching the variable resistance device from the second resistance state to a third resistance state, a resistance of the third resistance state greater than a resistance of the second resistance state; and
    writing second data by applying at least one set pulse voltage to set the variable resistance device, the application of the at least one set pulse voltage switching the variable resistance device from the third resistance state to the first resistance state, the resistance of the second resistance state greater than a resistance of the first resistance state.

13. The method of claim 12, wherein a polarity of the at least one first reset pulse voltage is different from a polarity of the at least one set pulse voltage and the at least one second reset pulse voltage.

14. The method of claim 12, wherein a magnitude of the at least one first reset pulse voltage is greater than a magnitude of the at least one set pulse voltage, and
    a magnitude of the at least one second reset pulse voltage is less than the magnitude of the at least one set pulse voltage.

15. The method of claim 12, wherein at least one of the at least one first reset pulse voltage and the at least one second reset pulse voltage is a plurality of pulse voltages.

16. The method of claim 12, wherein in the writing first data by consecutively applying the at least one first reset pulse and the at least one second reset pulse, the at least one first reset pulse is applied prior to the at least one second reset pulse,
    the at least one first reset pulse is a plurality of first reset pulses, and
    the at least one second reset pulse is a plurality of second reset pulses.

17. The method of claim 12, wherein the writing of the first data further includes consecutively applying one third reset pulse voltage and one fourth reset pulse voltage after the applying of the at least one second reset pulse voltage,
    the third reset pulse voltage is a same magnitude and polarity as the at least one reset pulse voltage,
    the fourth reset pulse voltage is a same magnitude and polarity as the at least one second reset pulse voltage,
    the at least one first reset pulse voltage is one first reset pulse voltage, and
    the at least one second reset pulse voltage is one second reset pulse voltage, the one second reset pulse voltage being applied after the one first reset pulse voltage.

18. The method of claim 12, wherein the resistance of the third resistance state is about 20 to about 1000 times greater than the resistance of the first resistance state.

19. A variable resistance device, comprising:
    a first electrode;
    a second electrode; and
    a variable resistance material layer between the first and second electrodes, the variable resistance material layer configured to switch from a first resistance to a second resistance upon application of a first reset pulse voltage, to switch from the second resistance to a third resistance upon application of a second reset pulse voltage, and to switch from the third resistance to the first resistance upon application of a set pulse voltage, the third resistance greater than the second resistance and the second resistance greater than the first resistance.

20. The variable resistance device of claim 19, wherein a magnitude of the first reset pulse voltage is about 2 times greater than a magnitude of the set pulse voltage.

21. The variable resistance device of claim 19, wherein a polarity of the first reset pulse voltage is different from a polarity of the set pulse voltage and the second reset pulse voltage.

22. The variable resistance device of claim 19, wherein a magnitude of the first reset pulse voltage is greater than a magnitude of the set pulse voltage, and
a magnitude of the second reset pulse voltage is less than the magnitude of the set pulse voltage.

23. A semiconductor device, comprising:
a variable resistance device configured to be switched from a first resistance state to a second resistance state upon application of a first reset pulse voltage, to be switched from the second resistance state to a third resistance state upon application of a second reset pulse voltage, and to be switched from the third resistance state to the first resistance state upon application of a set pulse, a resistance in the third resistance state greater than a resistance in the second resistance state, and the resistance in the second resistance state greater than a resistance in the first resistance state; and
a selection device connected in series to the variable resistance device.

24. The semiconductor device of claim 23, wherein a magnitude of the first reset pulse voltage is about 2 times greater than a magnitude of the set pulse voltage.

25. The semiconductor device of claim 23, wherein a polarity of the first reset pulse voltage is different from a polarity of the set pulse voltage and the second reset pulse voltage.

26. The semiconductor device of claim 23, wherein a magnitude of the first reset pulse voltage is greater than a magnitude of the set pulse voltage, and
a magnitude of the second reset pulse voltage is less than the magnitude of the set pulse voltage.

27. The semiconductor device of claim 23, wherein first data is written upon consecutive application of the first and second reset pulse voltages, and
second data is written upon application of the set pulse voltage.

28. The semiconductor device of claim 23, wherein the selection device is one of a transistor and a diode.

29. A method of operating an electronic system, the method comprising:
the method of operating a semiconductor device of claim 1,
wherein the electronic system includes a processor, a memory unit, an input/output device and an interface unit, and
the memory unit includes the semiconductor device.

30. A method of operating a memory card, the method comprising:
the method of operating a semiconductor device of claim 12,
wherein the memory card includes a controller and a memory unit, and
the memory unit includes the semiconductor device.

31. A memory card, comprising:
a controller; and
a memory unit including the variable resistance device of claim 19.

32. A memory card, comprising:
a controller; and
a memory unit including the semiconductor device of claim 23.

33. An electronic system, comprising:
a processor;
a memory unit including the semiconductor device of claim 23;
an input/output device; and
an interface unit.

* * * * *